(12) United States Patent  
Sinclair

(10) Patent No.: US 8,258,489 B2  
(45) Date of Patent: Sep. 4, 2012

(54) TRANSMISSION ENERGY CONTAMINATION DETECTOR

(75) Inventor: Frank Sinclair, Quincy, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 373 days.

(21) Appl. No.: 12/750,893

(22) Filed: Mar. 31, 2010

(65) Prior Publication Data

US 2011/0240847 A1    Oct. 6, 2011

(51) Int. Cl.
*H01J 37/00*    (2006.01)
*H01J 37/317*   (2006.01)

(52) U.S. Cl. ............... 250/492.1; 250/492.21; 250/397; 250/396 R

(58) Field of Classification Search ............... 250/492.1, 250/492.2
See application file for complete search history.

(56) References Cited

U.S. PATENT DOCUMENTS

| 7,250,617 B2 | 7/2007 | Renau et al. |
| 7,579,602 B2 | 8/2009 | Benveniste et al. |
| 2005/0178981 A1* | 8/2005 | Renau et al. ............ 250/492.21 |

* cited by examiner

*Primary Examiner* — Nikita Wells
*Assistant Examiner* — Johnnie L Smith

(57) ABSTRACT

An energy contamination detection apparatus includes a membrane and a charge collection plate disposed at a distance from the membrane. The membrane is configured to receive an ion beam and allow a portion of the ion beam having energy levels above a desired energy level to pass therethrough toward the charge collection plate and absorb or reflect portions of the ion beam having energy levels at or below the desired energy level. A voltage source is electrically coupled to the charge collection plate for providing a bias voltage to the charge collection plate. A detection circuit is coupled to the charge collection plate and is configured to detect energy contamination based on an amount of charge collected on the charge collection plate.

21 Claims, 2 Drawing Sheets

TRANSMISSION ENERGY CONTAMINATION DETECTOR

BACKGROUND OF THE INVENTION

1. Field of the Invention

Embodiments of the invention relate to the field of ion implantation. More particularly, the present invention relates to in-situ energy contamination detection in an ion implanter.

2. Discussion of Related Art

Ion implantation is a process used to dope ions into a work piece. One type of ion implantation is used to implant impurity ions during the manufacture of semiconductor substrates to obtain desired electrical device characteristics. Typically, arsenic or phosphorus may be doped to form n-type regions in the substrate and boron, gallium or indium is doped to create p-type regions in the substrate.

An exemplary high current ion implanter tool 100 is generally shown in FIG. 1 and includes an ion source chamber 102, and a series of beam line components that direct the ion beam to a wafer or substrate. These components are housed in a vacuum environment and configured to provide ion dose levels with high or low energy implantation based on the desired implant profile. In particular, implanter 100 includes an ion source chamber 102 to generate ions of a desired species. The chamber has an associated heated filament powered by power supply 101 to ionize feed gas introduced into the chamber 102 to form charged ions and electrons (plasma). The heating element may be, for example, an indirectly heated cathode.

Different feed gases are supplied to the source chamber to generate ions having particular dopant characteristics. The ions are extracted from source chamber 102 via a standard three (3) extraction electrode configuration used to create a desired electric field to focus ion beam 95 extracted from source chamber 102. Beam 95 passes through a mass analyzer chamber 106 having a magnet which functions to pass only ions having the desired charge-to-mass ratio to a resolving aperture. In particular, the analyzer magnet includes a curved path where beam 95 is exposed to the applied magnetic field which causes ions having the undesired charge-to-mass ratio to be deflected away from the beam path. Deceleration stage 108 (also referred to as a deceleration lens) includes a plurality of electrodes (e.g. three) with a defined aperture and is configured to output the ion beam 95. A magnet analyzer 110 is positioned downstream of deceleration stage 108 and is configured to deflect the ion beam 95 into a ribbon beam having parallel trajectories.

A magnetic field may be used to adjust the deflection of the ions via a magnetic coil. The ribbon beam is targeted toward a work piece which is attached to a support or platen 114. An additional deceleration stage 112 may also be utilized which is disposed between collimator magnet chamber 110 and support 114. Deceleration stage 112 (also referred to as a deceleration lens) is positioned close to a target substrate on platen 114 and may include a plurality of electrodes (e.g. three) to implant the ions into the target substrate at a desired energy level. Because the ions lose energy when they collide with electrons and nuclei in the substrate, they come to rest at a desired depth within the substrate based on the acceleration energy. The ion beam may be distributed over the target substrate by beam scanning, by substrate movement using platen 114, or by a combination of beam scanning and substrate movement.

Deceleration of the ions by one or more stages 112 may be required when forming devices with shallower junction depths, but at high current levels. A deceleration stage 112 is positioned reasonably close to the target substrate to reduce the distance the beam must travel at low energy where the efficiency of transporting the beam is poor. However, ions directed at a substrate may lose their charge in a charge exchange reaction with residual gas along the beam line. These ions, commonly referred to as "neutrals", are unaffected by one or more of the deceleration stages 112 and impact the target substrate at a higher energy level. This higher energy level causes the ions to implant deeper in the target substrate than desired and is Energy Contamination (EC). In other words, EC occurs when a fraction of the ion beam that is at a higher energy level for a given implant recipe reaches the target substrate. This is particularly problematic when forming, for example, a gate metal implant, where avoiding contamination of the oxide beneath this gate is important due to the fragility of the oxide layer.

Currently, attempts have been made to suppress and or deflect ions at higher energy levels than desired from reaching the target substrate to avoid EC through the use of high energy filters disposed downstream of the deceleration stage. However, a drawback associated with these filters is that a decelerated, low energy ion beam is very difficult to transport even over small distances because it is subject to large space charge blow-up. Thus, transporting the beam through an energy filter will not only attenuate the high energy neutrals, but will also attenuate the desired ions and prevent them from reaching the target substrate with a desired energy and at a desired concentration. Also, only a limited amount of current may be transported through such a filter, often with significant degradation of beam parallelism.

Other known techniques for limiting EC include the use of an electrostatic or magnetic bend disposed between the deceleration stage and the analyzer magnet, increased gas pumping to limit the neutralization of beam ions by residual gas, an aperture and liner design to prevent neutrals formed by collisions with the structures inside the implanter from reaching the workpiece, and limiting the voltage allowed when running deceleration to reduce the implanted depth of the contaminant ions.

In U.S. Pat. No. 7,250,617 entitled "Ion Beam Neutral Detection" assigned to the assignee of the present invention, a system and method for measuring the current of secondary electrons emitted due to the impact of energetic neutral particles is disclosed. This system measures a current of the ion beam at the collector plate wherein different portions of the current are measured depending on a bias voltage provided to the chamber. However, this requires the measuring of the various components of the beam current including the lower energy ions as well as the desired energy level ions and subtracting these measurements to determine the EC. This method of quantifying the high energy neutrals is thus dependent on the subtraction of two relatively large numbers and the error in the result is compounded by the arithmetic operation with a resulting loss in accuracy. Furthermore, this method depends on measuring the secondary electrons emitted from a surface when an ion or neutral atom impinged on that surface. However, secondary electron yields are very sensitive to surface cleanliness and can vary unpredictably. Accordingly, an improved EC detection system and method which provides a more direct measurement of the high energy ions associated with EC is desirable.

SUMMARY OF THE INVENTION

Exemplary embodiments of the present invention are directed to an energy contamination detection device. In an exemplary embodiment, the detection device includes a membrane having a thickness selected to block ions of an ion beam having a desired energy level and allow particles of the beam having energy levels above the desired energy level to pass therethrough. A housing including a support frame is used to support the membrane. A charge collection plate is disposed a distance from the membrane. The charge collection plate is configured to receive the particles of the ion beam having energy levels above the desired energy level. A voltage source is electrically coupled to the charge collection plate for providing a bias voltage to the charge collection plate. A detection circuit is coupled to the charge collection plate and is configured to detect energy contamination based on an amount of charge collected on the charge collection plate from the received particles of the ion beam having energy levels above the desired energy level.

In an exemplary energy contamination detection method, an ion beam is received by a membrane positioned within a process chamber of an ion implanter. A portion of the ion beam that is above a desired energy level passes through the membrane. A portion of the ion beam that is below the desired energy level is prevented from passing through the membrane. A bias voltage may be applied to a collection plate. The collection plate is spaced apart from the membrane and configured to receive the portion of the beam that is above the desired energy level. The current from the collection plate is measured and the energy contamination is detected if the current is above a threshold.

DESCRIPTION OF EMBODIMENTS

Figure 1:
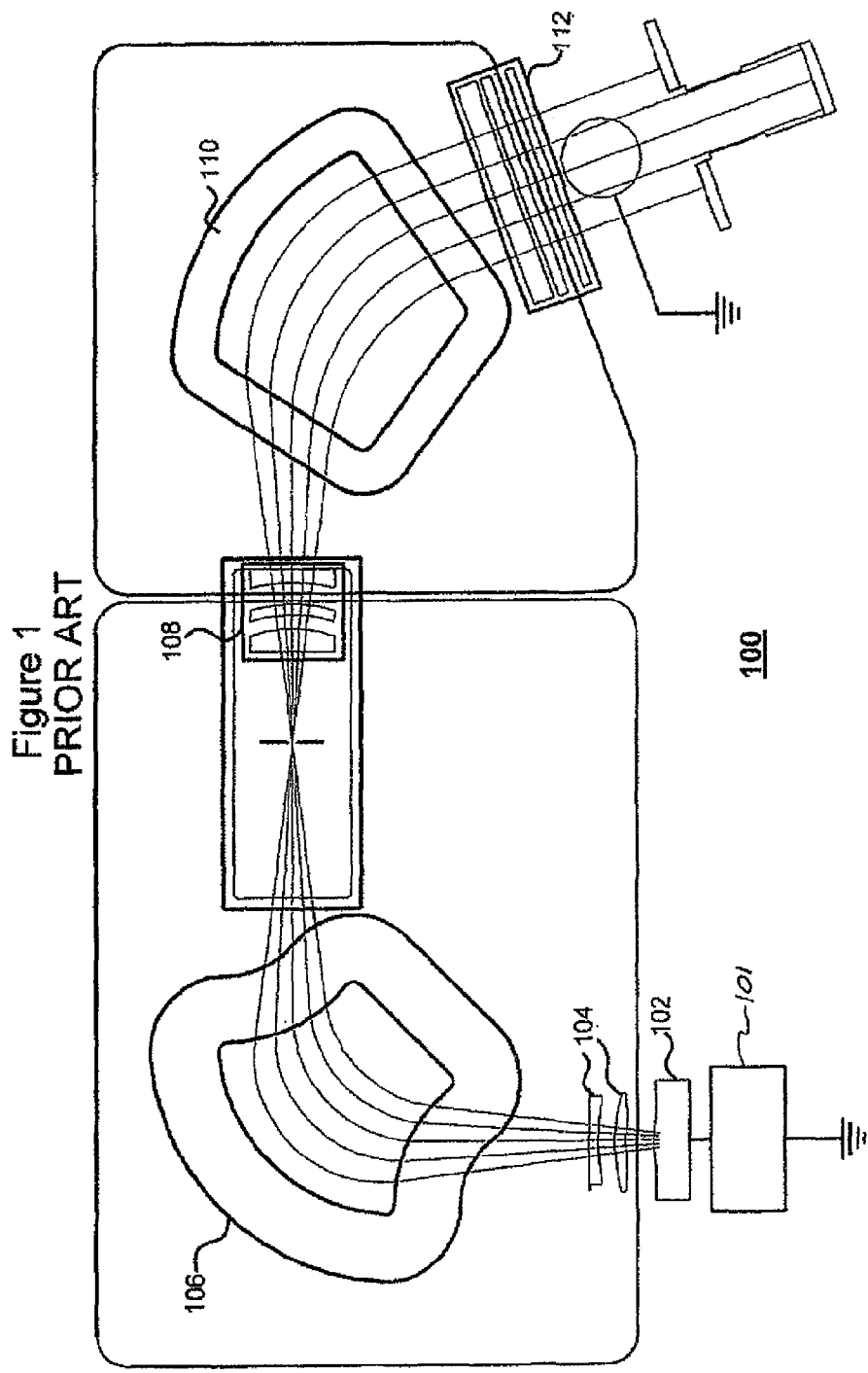
FIG. 1 is a block diagram of a conventional ion implanter tool.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

Figure 2:
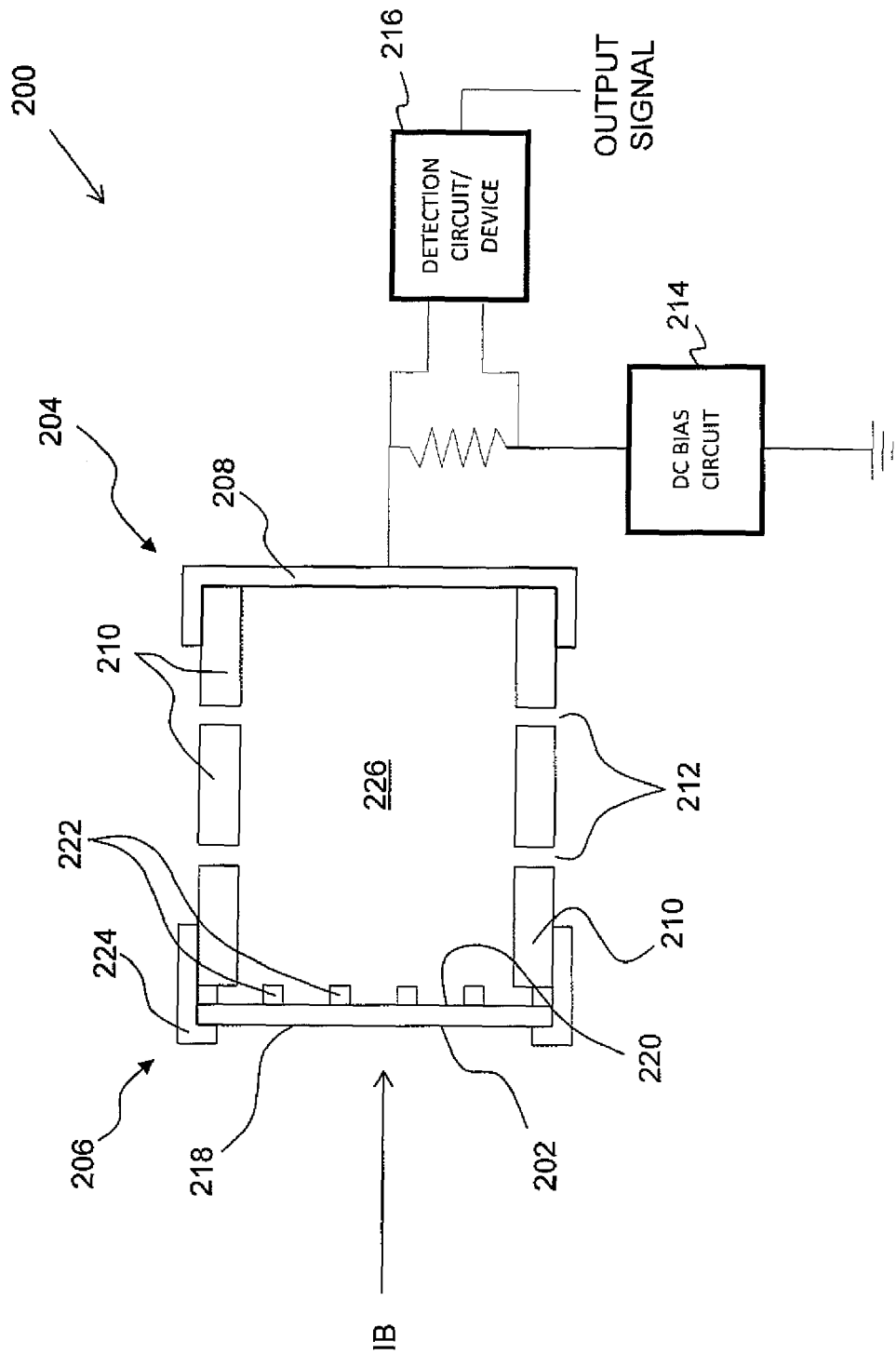
FIG. 2 is a block diagram of an exemplary EC detection system in accordance with the present disclosure.

FIG. 2 is a block diagram of an exemplary energy contamination (EC) detector 200, which may be disposed on or near platen 114 of an ion implanter 100. In particular, the detector 200 may replace a target substrate in situ to obtain the desired implant processing parameters. Once the desired parameters are achieved, the detector 200 is removed from or near the platen and replaced by the target substrate. EC detector 200 includes a membrane 202 supported by a housing 204 including a support frame 206. The housing 204 defines an interior chamber 226. A charge collection plate 208 is separated from membrane 202 by insulators 210 defining one or more pumping holes 212 therebetween. Charge collection plate 208 is coupled to a direct current (DC) bias circuit 214 and to a detection circuit or device 216.

Support frame 206 of housing 204 is configured to support membrane 202. When EC detection device 200 is positioned on or near platen 114, membrane 202 receives ion beam 250 comprised of ions and neutrals. Support frame 206 may include a grid 222 for providing a backing to membrane 202, and clamps 224 or other mounting device may be used to releasably secure membrane 202 to grid 222. Membrane 202 receives the ion beam 250 and only allows the portion of the beam having high energy particles (EC) to emerge on the downstream side of membrane 202. These particles may emerge as ions or neutrals that release secondary electrons which provides a detectable signal at collection plate 208 as described below. The energy particles that form beam 250 that are not part of the EC particles (i.e. the ions at or below the desired lower energy level for shallow implantation) are prevented from emerging from surface 220 and are essentially "filtered" out by membrane 202. Thus, only the high energy contaminating particles emerge from the surface 220 of membrane 202 and can be measured directly without any numerical subtraction.

As mentioned above, prior attempts at EC detection required the measuring of the various components of the beam current including, for example, the total beam and the desired energy level ions and then inferring the EC by subtracting these two quantities. In contrast, in the present disclosure the role of the subtraction operation is substituted by the physical filtering of the EC particles in the membrane.

The thickness of membrane 202 may be selected based on an energy of the desired ion beam 250 for a specific implant recipe for fabricating devices on a substrate or wafer. For example, membrane 202 may have a thickness of approximately 30 nm for detecting EC in a semiconductor fabrication process using an ion beam having an energy of approximately 300 keV, and a thickness of approximately 15 nm for detecting EC for a recipe using a 150 keV process. Membrane 202 may be a diamond-like carbon (DLC) foil such as those available from Micromatter of Vancouver, British Columbia, Canada. Membranes 202 may be fabricated from other similar materials and have a thickness between approximately 10 nm and approximately 600 nm. However, membranes 202 having other thicknesses may also be implemented.

Charge collection plate 208 is fabricated from a conductive material and is electrically separated from support frame 206 by insulating walls 210. This enables a DC bias to be applied to collection plate 208 without being applied to membrane 202. Insulating sidewalls 210 may be formed from any substantially non-conductive material. One or more holes 212 enables interior chamber 226 of EC detection device 200 to be pumped with gas for equilibrating the pressure or the gas concentration within the chamber. Alternatively, holes 212 may be used to create a vacuum within chamber 226. Holes 212 also enable the gas composition and pressure in the interior chamber 226 of EC detection device 200 to provide a consistent proportional electron gain. For very small amounts of EC, a higher DC bias may be applied to operate in an avalanche or Geiger counter mode and count individual high energy ions.

Detection circuit or device 216 may be any circuit or device configured to detect a voltage or current on charge collection plate 208. In one embodiment, detection device 216 is a nanoammeter such as, for example, a Model 285 nanoammeter available from Monroe Electronics of Lyndonville, N.Y.

In operation, a membrane 202 is loaded onto housing 204 of EC detection device 200. As described above, the thickness of membrane 202 is selected based on a desired ion beam energy in a recipe for fabricating devices on a target substrate. The EC device 200 is positioned on platen 114 of ion implanter 100 in the position in which a target substrate is to be positioned during the fabrication process. The EC detector 200 and in particular housing 204, has a sufficient size to receive at least a portion of incident ion beam 250. Obviously, the size of detector 200 is such that it fits within the confines of a processing chamber of ion implanter 100. Once EC device 200 is positioned on platen 114, an ion bean 250 is incident on membrane 202.

Membrane 202 absorbs or deflects ions having an appropriate energy for the semiconductor fabrication recipe. Only the EC particles, which may be ions or neutrals, emerge from the downstream surface 220 of membrane 202 toward charge collection plate 208. Some of these high energy particles will be ionized as their remaining kinetic energy is greater than the electron binding energy. These ions are collected via collection plate 208 by applying a relatively small DC bias to the collection plate with DC bias circuit 214. For example, ions may be collected by providing a negative DC bias (e.g., 10-50V) to charge collection plate 208. Alternatively, as the EC particles emerge from the downstream surface 220 of membrane 202, they may be negatively charged ions or secondary electrons which are generated by the neutrals. These negatively charged particles may be collected by applying a positive DC bias to charge collection plate 208. Larger DC biases may be applied to induce electron multiplication in the residual gas in order to increase the collected current above a threshold level associated with these secondary electrons.

As charge accumulates on charge collection plate 208, a measurable signal (e.g., voltage or current) develops on collection plate 208. For example, a typical high current ion beam has a current density of approximately $100\,\mu A/cm^2$, and a typical maximum EC requirement for a semiconductor wafer is approximately 0.1%. Accordingly, the detection device 216 of EC detection device 200 having a membrane 202 with an area of approximately 1 $cm^2$ may measure a current of approximately 100nA, which identifies the presence of EC contamination. Consequently, an operator may adjust the settings of ion implanter 100, replace membrane 202, and have ion implanter 100 transmit another ion beam towards membrane 202 to test for energy contamination.

If a current or voltage above a threshold is not detected by detection device 216, then the ion implanter 100 is properly calibrated for fabricating devices on the semiconductor wafer according to the recipe for which the EC detection was performed. Accordingly, the ion implanter 100 may then be used to fabricate devices on semiconductor wafers with a lower risk of energy contamination.

While the present invention has been disclosed with reference to certain embodiments, numerous modifications, alterations and changes to the described embodiments are possible without departing from the sphere and scope of the present invention, as defined in the appended claims. Accordingly, it is intended that the present invention not be limited to the described embodiments, but that it has the full scope defined by the language of the following claims, and equivalents thereof.

What is claimed is:

1. An energy contamination detection device, comprising:
a membrane having a thickness selected to block ions of an ion beam having a desired energy level and allow particles of the beam having energy levels above said desired energy level to pass therethrough;
a charge collection plate disposed at a distance from the membrane, said charge collection plate configured to receive said particles of the ion beam having energy levels above said desired energy level;
a detection circuit coupled to the charge collection plate and configured to detect energy contamination based on an amount of charge collected on the charge collection plate from the received particles of the ion beam having energy levels above said desired energy level.

2. The energy contamination detection apparatus of claim 1, further comprising a voltage source electrically coupled to the charge collection plate for providing a bias voltage to the charge collection plate.

3. The energy contamination detection apparatus of claim 2, wherein the voltage source is a direct current (DC) voltage source configured to provide one of a positive DC bias voltage or a negative DC bias voltage to the charge collection plate.

4. The energy contamination detection apparatus of claim 1 further comprising a housing including a support frame for supporting the membrane.

5. The energy contamination detection apparatus of claim 1, wherein the membrane includes a diamond-like carbon foil.

6. The energy contamination detection apparatus of claim 1, wherein the membrane has a thickness between approximately 10 nm and 600 nm.

7. The energy contamination detection apparatus of claim 4, wherein the support frame is separated from the collection plate by insulating sidewalls.

8. The energy contamination detection apparatus of claim 7, wherein the insulating sidewalls define openings for equilibrating a pressure or gas concentration within the apparatus.

9. The energy contamination detection apparatus of claim 1, wherein the detection circuit is configured to measure a current resulting from energy contamination.

10. The energy contamination detection apparatus of claim 1, wherein the membrane is releasably supported by a support frame of a housing.

11. The energy contamination detection apparatus of claim 1, wherein the particles comprise ions.

12. The energy contamination detection apparatus of claim 1, wherein the particles comprise neutrals.

13. An energy contamination detection method, comprising:
receiving an ion beam at a surface of a membrane supported by a housing;
allowing a portion of the ion beam that is above a desired energy level to pass through the membrane;
preventing a portion of the ion beam that is below the desired energy level from passing through said membrane;
applying a bias voltage to a collection plate of the housing, the collection plate spaced apart from the membrane and configured to receive said portion of the beam that is above the desired energy level;
measuring a current of the collection plate; and
detecting energy contamination if the current is above a threshold.

14. The energy contamination detection method of claim 13, wherein the bias voltage is supplied by a direct current (DC) voltage source.

15. The energy contamination detection method of claim 13, wherein the bias voltage is one of a positive DC voltage or a negative DC voltage.

16. The energy contamination detection method of claim 13, wherein the parameter is a current through an ammeter resulting from one of ions contacting the collection plate or electrons contacting the collection plate.

17. The energy contamination detection method of claim 13, wherein the membrane has a thickness based on the desired energy level of the ion beam, wherein said membrane is a diamond-like carbon foil having a thickness between approximately 10 nm and approximately 600 nm.

18. The energy contamination detection method of claim 13, further comprising:

selecting a thickness of the membrane based on a desired energy level;

releasably securing the membrane to the housing; and placing the membrane and housing in an ion implanter.

19. A ion implanter system comprising:

a source for generating an ion beam for implanting a target substrate; and an energy contamination detector including a membrane having a thickness based on a desired energy level of the ion beam, said ion beam comprising ions and neutrals, said membrane configured to receive said ion beam and allow ions and neutrals of the beam that are above the desired energy level to emerge from the membrane and prevent ions at or below the desired energy level from passing therethrough;

a housing for supporting the membrane and including a charge collection plate disposed at a distance downstream from the membrane;

a voltage source electrically coupled to the collection plate for providing a direct current (DC) bias voltage to the charge collecting plate; and a detection device coupled to the charge collecting plate for detecting one of electrons generated by said neutrals contacting the charge collecting plate or ions contacting the charge collecting plate.

20. The energy contamination detection apparatus of claim 19, wherein the housing includes insulating sidewalls for electrically separating the membrane and the charge collecting plate.

21. The energy contamination detection apparatus of claim 19, wherein the membrane is a diamond-like carbon foil.

* * * * *